(12) United States Patent
Enicks

(10) Patent No.: US 7,080,440 B2
(45) Date of Patent: Jul. 25, 2006

(54) VERY LOW MOISTURE O-RING AND METHOD FOR PREPARING THE SAME

(75) Inventor: Darwin G. Enicks, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 302 days.

(21) Appl. No.: 10/327,321

(22) Filed: Dec. 20, 2002

(65) Prior Publication Data
US 2004/0117968 A1   Jun. 24, 2004

(51) Int. Cl.
B23P 11/02 (2006.01)

(52) U.S. Cl. .................. 29/450; 29/888.3; 277/910; 277/913

(58) Field of Classification Search .............. 29/888.3, 29/450; 277/DIG. 910, 913
See application file for complete search history.

(56) References Cited

U.S. PATENT DOCUMENTS

| | | | |
|---|---|---|---|
| 5,316,171 A | 5/1994 | Danner, Jr. et al. | 220/423 |
| 6,074,698 A | 6/2000 | Sakurai et al. | 427/307 |
| 6,352,591 B1 | 3/2002 | Yieh et al. | 118/697 |
| 2002/0135761 A1 | 9/2002 | Powell et al. | 356/316 |

OTHER PUBLICATIONS

"Outgassing and Weight Loss of Elastomers" Problem Solving Products, Inc. copyright 1997-2005. available at: http://www.pspglobal.com/outgassing-elastomers.html (visited Jul. 14, 2005).*

Phil Danielson, "Gas Loads and O-rings" A Journal of Practical and Useful Vacuum Technology (Aug. 2000). available at: http://www.vacuumlab.com/Articles/Gas%20Loads%20and%20O-Rings.pdf (visited Jul. 14, 2005).*

"O-Ring Performance" Kurt J. Lasker Company. copyright 1996-2004. available at: http://www.lesker.com/newweb/Vacuum_Components/O_Ring_Seals/O-ring_performance.cfm?CFID=266017&CFTOKEN=49827656 (visited Jul. 14, 2005).*

Phil Danielson, "The Effects of Humidity on Vacuum Systems" A Journal of Practical and Useful Vacuum Technology (Jun. 2001). available at: http://www.vacuumlab.com/Articles/VacLab27.pdf (visited Jul. 14, 2005).*

Phil Danielson, "Desorbing Water in Vacuum Systems: Bakeout or UV?" A Journal of Practical and Useful Vacuum Technology (Jan. 2001). available at: http://www.vacuumlab.com/Articles/VacLab22%20.pdf (visited Jul. 14, 2005).*

(Continued)

*Primary Examiner*—Eric Compton
(74) *Attorney, Agent, or Firm*—Schneck & Schneck; Thomas Schneck; Nissa M. Strottman

(57) ABSTRACT

Very low moisture o-rings are prepared by placing standard o-rings under vacuum in an inert atmosphere for a period of time sufficient to achieve a desired outgassing rate. Heat is not applied. While the o-rings are under vacuum, moisture is removed from the o-rings via diffusion transport.

4 Claims, 3 Drawing Sheets

OTHER PUBLICATIONS

Phil Danielson, "Sources of Water Vapor in Vacuum Systems" A Journal of Practical and Useful Vacuum Technology (Sep. 2000). available at: http://www.vacuumlab.com/Articles/Sources%20of%20Water%20Vapor.pdf (visited Jul. 14, 2005).*

Sherman Rutherford, "The Benefits of Viton Outgassing" Duniway Stockroom Corp. Feb. 1997. available at: http://www.duniway.com/images/pdf/pg/viton-out-gassed-orings.pdf (visited Jul. 21, 2005).*

Viton Gaskets Brochure, Duniway Stockroom Corp. available at: http://www.duniway.com/images/pdf/pg/p-sp05b-viton-gaskets.pdf (visited Jul. 21, 2005).*

Robert Lowry, "Sources and Control of Volatile Gases Hazardous to Hermetic Electronic Enclosures" 1999 International Symposium on Advanced Packaging Materials, pp. 94-99.*

P. Danielson, "Understanding Water Vapor in Vacuum Systems", *Microelectronic Manufacturing and Testing*, Jul. 1990, 2 pages.

P. Danielson, "Gas Loads and O-Rings", *A Journal of Practical and Useful Vacuum Technology*, 2000, 4 pages.

P. Danielson, "Sources of Water Vapor in Vacuum Systems", *A Journal of Practical and Useful Vacuum Technology*, 2000, 4 pages.

T. Ghani et al., "Effect of Oxygen on Minority-Carrier Lifetime and Recombination Currents in $Si_{1-x}Ge_x$ Heterostructure Devices", *Appl. Phys. Lett.*, vol. 58, Mar. 12, 1991, pp. 1317-1319.

* cited by examiner

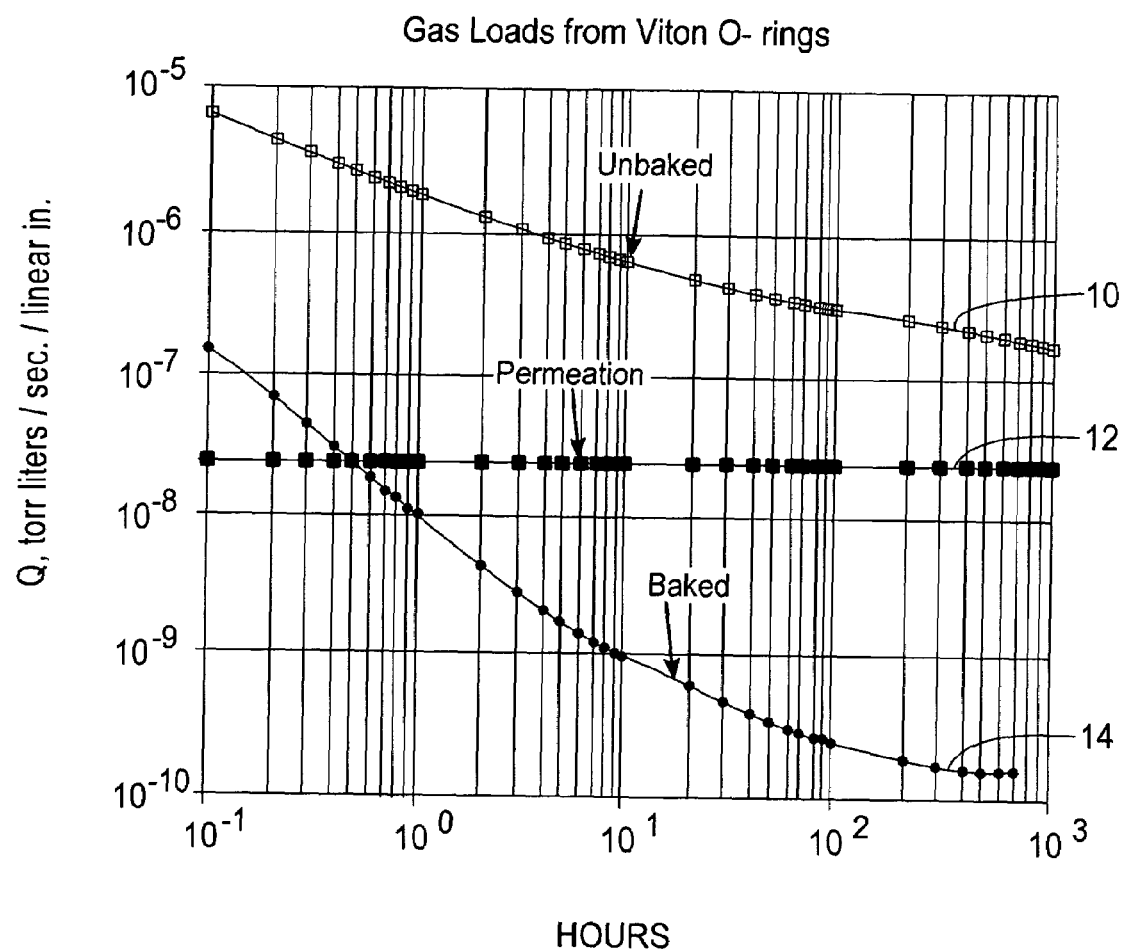
Fig._1
(Prior Art)

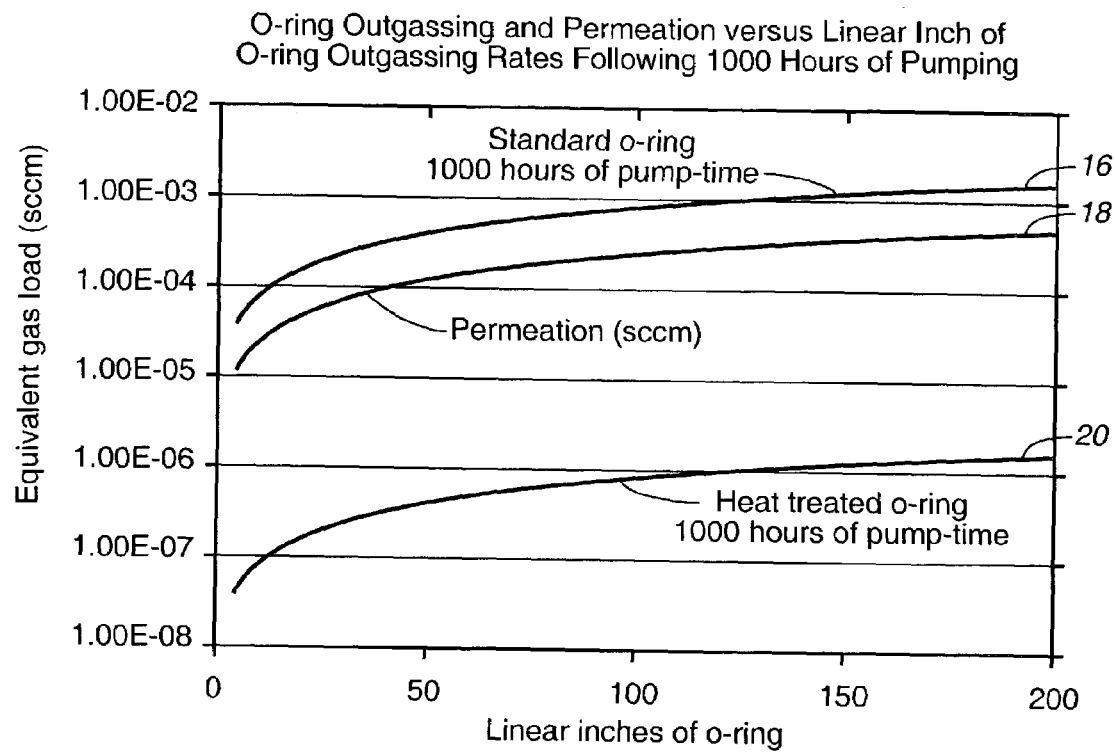
FIG._2
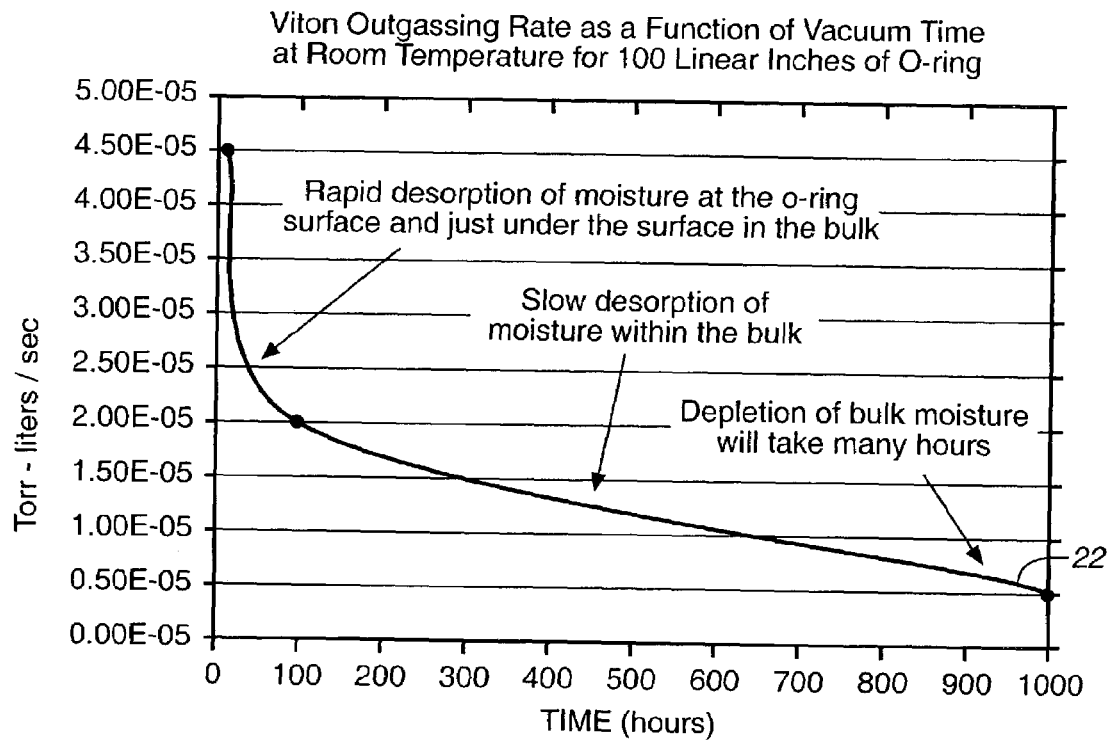
FIG._3

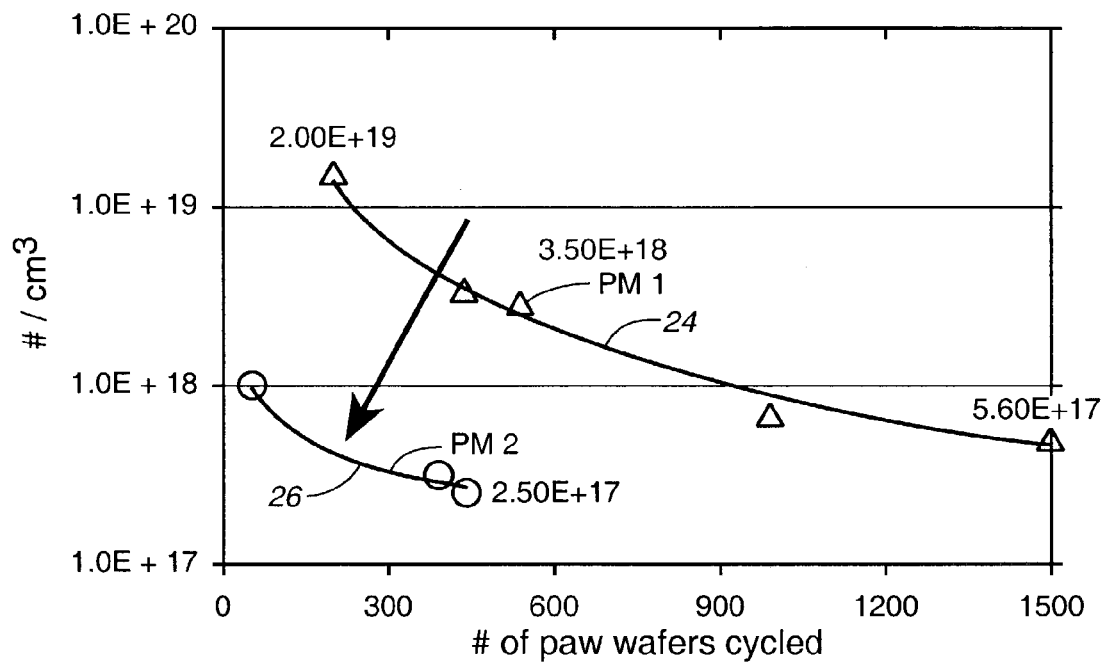
FIG._4
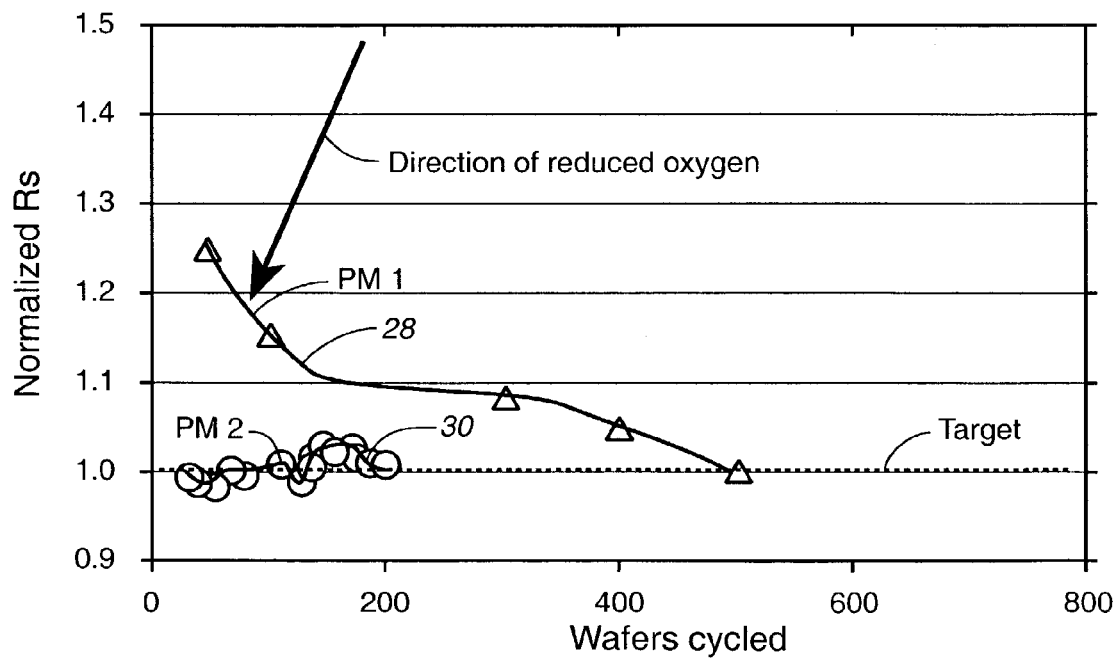
FIG._5

VERY LOW MOISTURE O-RING AND METHOD FOR PREPARING THE SAME

FIELD OF THE INVENTION

This invention relates to the preparation of sealing o-rings, especially very low moisture o-rings.

BACKGROUND OF THE INVENTION

A well-known method of semiconductor chip fabrication involves depositing epitaxially-grown silicon germanium (SiGe) on a silicon substrate in a chemical vapor deposition (CVD) reactor. This deposition of SiGe on the silicon substrate provides a layer of material to form transistors. SiGe deposition is commonly used to produce high-speed, low-power RF and photonic devices.

During SiGe deposition, oxygen present in the CVD reactor chamber is incorporated into the SiGe film. Although the mechanism for enhanced oxygen incorporation in SiGe films is not fully understood, it is a well-documented phenomenon. Elevated oxygen levels in the CVD reactor chamber used to deposit SiGe cause numerous problems in the SiGe films produced in the CVD reactor chamber. Among these problems are elevated sheet resistance of the SiGe p-type base and poor crystal quality. In addition, the reactor must be taken offline for weeks or even months before acceptable levels of oxygen in the chamber are achieved; while the reactor is offline, it is completely disassembled to remove moisture, reassembled, and then tested until acceptable oxygen levels in SiGe films are achieved. This is costly as the offline reactor clearly cannot be used for manufacturing semiconductor chips.

Reducing and stabilizing oxygen levels in the CVD reactor is desirable because it would reduce variation in resistance of the SiGe p-type base, improve crystal quality, and also increase the amount of time a single CVD reactor is online and used for manufacturing chips. In addition, minority carrier lifetime increases by 1.33 orders of magnitude for each decade of oxygen reduction. (T. Ghani et al., "Effect of Oxygen on Minority-Carrier Lifetime and Recombination Currents in $Si_{1-x}Ge_x$ Heterostructure Devices," Applied Physics Letters, 58(12), 1991) Increasing the minority carrier lifetime would improve the performance of the semiconductor chip by increasing the number of charge carriers.

Efforts to reduce the effects of elevated oxygen levels or SiGe base resistance in CVD reactors have focused on adding diborane ($B_2H_6$) to the reaction chamber. While the addition of boron does reduce the sheet resistance of the SiGe p-type base, it may require other process adjustments which would ultimately have a negative effect on the process's stability. For instance, it has been demonstrated that variations to $B_2H_6$ flow can modulate the SiGe base width and Ge concentration.

It is known that the elevated oxygen levels in a CVD reactor are due to outgassing and permeation of gas (moisture and solvents) from the sealing o-rings used on a CVD reactor. Outgassing is a result of gas, usually water vapor, desorbing from the CVD reactor chamber-side surface of the o-ring as well as gas in the bulk of the o-ring diffusing to the surface of the o-ring, where it is desorbed. Gas from the atmosphere can permeate across the bulk of the o-ring via diffusion transport and into the reactor chamber by desorbtion. (P. Danielson, "Gas Loads and O-Rings," A Journal of Practical and Useful Vacuum Technology) Once moisture is in the reactor chamber, it will adsorb and desorb over and over.

Permeation is a function of material properties of the o-rings, how many linear inches of the o-rings are exposed to vacuum, and the pressure differential across the membrane or seal. While the gas load resulting from permeation is constant, the gas load resulting from outgassing and virtual leaks fluctuates; generally, permeation rates determine the lower boundary of oxygen concentration in the CVD reactor while outgassing rates set the upper boundary of oxygen concentration in the reactor. O-ring permeation can be described mathematically by the following equation:

$$Q = K \frac{P_1^{1/j} - P_2^{1/j}}{h},$$

where h is the effective material thickness, K is the permeation constant, and j is the dissociation constant (generally, j=1 for gases in non-metals, j=2 for diatomic gas in metal).

As shown in FIG. 1 (taken from Phil Danielson, "Gas Loads and O-Rings," A Journal of Practical and Useful Vacuum Technology, 2002), when a new unbaked o-ring is installed on a vacuum system, the outgassing via diffusion transport of the unbaked o-ring 10 is responsible for a gas load higher that that due to permeation 12. As pumping time in the vacuum system increases, the gas load due to outgassing from the unbaked o-ring 10 decreases and permeation 12 becomes responsible for the primary gas load. The gas load due to permeation 12 remains constant. The gas load due to outgassing from a baked o-ring 14 over time becomes lower than that due to permeation 12 but, as will be noted in greater detail below, baked o-rings may be unsuitable as sealing rings in CVD reactors due to effects to elasticity and potentially the permeation properties.

In SiGe deposition, outgassing from the o-rings may affect the stability of the process and therefore frequently requires adjustments to the process. It would be desirable to reduce the oxygen concentration in the CVD reactor to levels due to permeation since, as noted above, oxygen levels due to permeation are constant over time and generally are lower than oxygen levels due to outgassing.

The gas load from the o-rings is due in large part to the manufacturing process. A new o-ring may contain unreacted monomer, solvents, volatile curing agents, and water vapor. The curing process may also increase the gas load since HF is formed during curing and acid acceptors such as MgO are added to react with HF. (Id.) It can take weeks or months for the water in a new ring to outgas; however, in an oxygen-sensitive process such as SiGe deposition in a CVD reactor, this can be extremely expensive since it removes the CVD reactor from the manufacturing process until acceptable oxygen levels are achieved. O-rings may be baked at atmosphere before installation but this only removes some of the water trapped in the o-ring bulk and may affect the elasticity of the o-ring, making it unsuitable for sealing the CVD reactor. The vacuum baking will remove a large portion of moisture but the effect on elasticity, mass loss, and permeation rates are a serious concern.

Although vacuum and/or heat-treated o-rings may be purchased from vendors, the gas load in these o-rings is still high. The lowest recorded level of oxygen in SiGe film using low-moisture o-rings per the vendor specifications for preparation (wiping the o-ring with isopropyl alcohol before installation) is $10^{18}$ atoms/cc of oxygen; this oxygen level was achieved only after approximately 1500 wafers had been processed over the course of more than five weeks. Given the amount of time it takes for a new o-ring to outgas, the SiGe deposition process may be unstable for weeks following a preventive maintenance procedure where a new o-ring is installed before the oxygen concentration in a CVD reactor to reach an acceptable level and consistent performance is achieved. Therefore, it would be desirable to have moisture-depleted o-rings that could be installed on a CVD reactor without requiring the reactor to be offline for a long period of time until acceptable oxygen levels are reached.

It is an object of this invention to provide a preparation for sealing o-rings that removes excess moisture from the bulk of the o-ring without affecting the o-ring's elasticity, mass, and permeation rate.

It is an object of this invention to provide o-rings with a low gas load.

It is another object of the invention to provide o-rings for CVD reactors which will not create elevated oxygen levels in the reactor chamber due to outgassing.

It is yet another object of this invention to provide o-rings for use with CVD reactors so that oxygen levels in a CVD reactor are close to permeation levels which remain constant over time.

It is yet another object of this invention to provide moisture-depleted o-rings for use with a CVD reactor such that the oxygen concentration in SiGe films are reduced.

SUMMARY OF THE INVENTION

The objects are met by a method for preparing o-rings in which the o-rings are placed under vacuum in an inert atmosphere ($N_2$, for instance) for a predetermined amount of time. Heat is not applied. While the o-rings are under vacuum, moisture is removed from the o-rings via diffusion transport.

When o-rings are prepared in the above fashion and then fastened to a CVD reactor, the oxygen levels in SiGe film are reduced to levels below typical secondary ion mass spectometry (SIMS) detection, i.e., below $2 \times 10^{17}$ atoms/cc (compared with $10^{18}$ atoms/cc of oxygen when o-rings not placed under vacuum were used).

BRIEF DESCRIPTION OF THE DRAWINGS

FIG. 1 is a graph showing the gas load of an o-ring under vacuum over time.

FIG. 2 is a chart showing o-ring outgassing and permeation per linear inch of an o-ring following 1000 hours under vacuum.

FIG. 3 is a graph showing the outgassing rate for 100 linear inches of a viton o-ring as a function of vacuum time at room temperature.

FIG. 4 is a graph of in-film oxygen concentration versus the number of wafers cycled through a CVD reactor following a maintenance procedure in which either standard or moisture-depleted o-rings are installed on the CVD reactor.

FIG. 5 is a graph of normalized sheet resistance versus the number of wafers cycled through a CVD reactor following a maintenance procedure in which either standard or moisture-depleted o-rings are installed on the CVD reactor.

DETAILED DESCRIPTION

For best results, double clean-room gloves should be worn whenever o-rings are handled. The gloves should be changed frequently, every 30 or 60 minutes, and must be changed if they are contaminated. The o-rings should be kept in packaging in an $N_2$ environment until they are to be processed to avoid unnecessary exposure to the atmosphere. All work surfaces with which the o-rings may come in contact should be wiped with isopropyl alcohol (IPA).

Before placing the o-ring under vacuum, the vacuum's $N_2$ source should be checked to ensure that it is purified to <1 ppm $H_2O$. The interior of the vacuum vessel should be wiped with IPA. For best results, the vacuum chamber should also be checked to verify that there are no external leaks and a rate-of-rise (ROR) should be performed to ensure it is less than 1 mtorr/minute. (An ROR procedure may be performed by: 1) turning off all gases and pump the vessel to base pressure; 2) isolating the vacuum vessel by closing the isolation valve; 3) recording the base pressure and allow the system to "leak-up" for a period of time ranging from 30 minutes to several hours; and 4) calculating the ROR by subtracting the initial pressure from the final pressure and dividing that number by the total leak-up time.) If the ROR exceeds 1 mtorr/minute, the system should be pumped and purged with $N_2$ until the ROR requirement is satisfied.

Prior to placing a new o-ring under vacuum, it should be dry-wiped with isopropyl alcohol (IPA) on a clean-room wipe. The o-ring should be placed in the vacuum chamber immediately after the IPA wipe. The $N_2$ flow should be 1 standard liter per minute (slpm) and the vacuum pressure should range from 1 mtorr–50 torr. In other embodiments, an $N_2$ flow greater than 1 slpm may be used as long as the vacuum pressure range noted above can be maintained. Low temperatures, ranging from 20° C. to 200° C. should be used. As noted above, heat facilitates the removal of moisture from an o-ring but excessive application of heat may result in loss of mass, shape, and flexibility and, therefore, difficult installation, premature failure, and increased permeation rates.

The o-rings should remain under vacuum with nitrogen purge for the minimum process time. The minimum process time takes the following into consideration: 1) outgassing rates as a function of pump time for baked and unbaked materials; 2) dimensions, principally length, of o-ring exposed to vacuum and the outgassing rate per linear inch of o-ring; and 3) if dopants are used, achieving outgassing rates that are 2 to 3 decades below the dopant injection (diborane injection levels for p-type SiGe are in the µ-sccm (standard centimeters cubed per minute) to m-sccm range).

The outgassing rate is expressed in terms of [(pressure×volume)/(time×length)], usually torr-litter/sec-inch, or throughput per linear inch. This is converted to sccm as follows: $Q_{tot} = Q_{inch}$ (1 stdatm/760 torr)(1000 cc/liter)(60 sec/min)(x), where $Q_{tot}$=total gas load from o-rings in sccm and x=linear inches of o-ring exposed to vacuum.

Outgassing rates may be obtained from vendors or by using the rate-of-rise (ROR) technique. In the ROR technique, the o-rings are placed under vacuum and the ROR is measured. The chamber ROR that was predetermined during the vacuum preconditioning procedures is substracted and the resulting ROR is converted to the equivalent outgassing rate.

In one embodiment of the invention, the outgassing rate may be calculated as follows. Referring to FIG. 1, the total outgassing of an unbaked VITON o-ring (a type of fluorocarbon resin o-ring) after a given number of hours may be obtained from experiments and calculations (in this instance performed by Phil Danielson and taken from "Gas Loads and O-Rings," A Journal of Practical and Useful Vacuum Technology, 2002). Assuming a process time here of 1000 hours (depending on the size and type of o-ring, process times may vary), the total outgassing per linear inch is approximately $3 \times 10^{-7}$ torr-liters/sec/linear-inch. Using the equation above ($Q_{tot}=Q_{inch}$ (1stdatm/760 torr) (1000 cc/liter) (60 sec/min) (x) where $Q_{tot}$=total gas load from o-rings in sccm and x=linear inches of o-ring exposed to vacuum), the total outgassing rate of the o-ring surface exposed to vacuum may be calculated.

FIG. 2 shows o-ring outgassing and permeation 18 versus linear inches of o-ring following 1000 hours of pumping for a unbaked o-ring 16 and a baked o-ring 20. Not surprisingly, as the number of linear inches in an o-ring increases, the gas load due to outgassing for both the baked 20 and unbaked 16 o-ring as well as permeation 18 increase.

FIG. 3 shows the outgassing rate 22 for 100 linear inches of a VITON o-ring as a function of vacuum time at room temperature. As shown in FIG. 3, depletion of bulk moisture for a VITON o-ring having 100 linear inches of material exposed to vacuum takes many hours. Using the equation discussed above in FIG. 1, $Q_{tot}=Q_{inch}$ (1 stdatm/760 torr) (1000 cc/liter) (60 sec/min) (x), where $Q_{tot}$=total gas load from o-rings in sccm and x=linear inches of o-ring exposed to vacuum, for an o-ring having 100 linear inches exposed to vacuum, and assuming the total outgassing per linear inch ($Q_{inch}$) is approximately $3 \times 10^{-7}$ torr-liters/sec/linear-inch, the outgassing rate for this o-ring is $3 \times 10^{-5}$ torr-liters/sec (on the order of $B_2H_6$ injection to SiGe films). Similar calculations may be performed for differently-sized o-rings made of different materials. Determining the required processing time to deplete moisture in an o-ring may require several iterations of the above calculations. For instance, if 1000 hours under vacuum is more than sufficient, the processing time should be recalculated by using 500 hours, etc. A few iterations may be required.

Two different techniques may be used to determine when the moisture removal process described above has reached its end point. Residual gas analyzer (RGA) techniques may be used, though this data may be difficult to interpret due to the extremely low partial pressure of oxygen and $H_2O$ within the system. Another technique is to measure in-film incorporation of oxygen by secondary mass spectometry (SIMS). FIG. 4 shows the in-film oxygen concentration (determined by SIMS) as a function of the number of wafers cycled through the CVD reactor after performing a preventive maintenance procedure (PM1) where new standard o-rings are installed compared with a preventive maintenance procedure (PM2) where moisture-depleted o-rings are installed. PM1 24 shows in-film oxygen concentration when standard o-rings are used. After about 200 wafers are cycled, in-film oxygen concentration is $2 \times 10^{19}$ atoms/cc. The in-film oxygen concentration drops to $3.5 \times 10^{18}$ atoms/cc after about 500 wafers are recycled, and, after 1500 wafers have been cycled, the in-film oxygen concentration drops to $5.6 \times 10^{17}$ atoms/cc. When moisture-depleted o-rings are used in PM2 26, the initial in-film oxygen concentration is $10^{18}$ atoms/cc. After about 450 wafers are processed, in-film oxygen concentration is $2.5 \times 10^{17}$ atoms/cc. The use of moisture-depleted o-rings on a CVD reactor clearly leads to lower in-film oxygen concentrations that are achieved much more quickly than in systems using standard, non-moisture-depleted o-rings.

FIG. 5 shows normalized sheet resistance versus the number of wafers cycled in a CVD reactor following preventive maintenance procedures PM1 and PM2. PM1 28, which employs standard, non-moisture-depleted o-rings, results in a sheet resistance of approximately 1.25 after about 50 wafers are recycled; the sheet resistance does not drop to 1.0 until approximately 500 wafers have been recycled. In contrast, PM2 30, which employs moisture-depleted o-rings, results in a normalized sheet resistance of approximately 1.0 almost immediately; this sheet resistance remains more or less constant. Referring to both FIGS. 4 and 5, it appears that an in-film oxygen concentration of $10^{18}$ atoms/cc, the initial in-film oxygen concentration achieved by using moisture-depleted o-rings in PM2 26 as shown in FIG. 4, represents the point at which oxygen no longer affects sheet resistance since, as shown in FIG. 5, a normalized sheet resistance of 1.0 is achieved almost immediately when moisture-depleted o-rings are used in PM2 30, where, as shown in FIG. 4, the initial in-film oxygen concentration is $10^{18}$ atoms/cc. This "sheet resistance versus oxygen threshold" will be process dependent; however, lowering oxygen is a must for any process threshold.

Referring to FIGS. 4 and 5, it is clear that maintenance procedures which use moisture-depleted o-rings achieve acceptable oxygen concentrations in a CVD reactor far more quickly than procedures which do not. In-film oxygen levels below SIMS detection, i.e., $2 \times 10^{17}$ atoms/cc have been demonstrated on a regular basis. In addition, using moisture-depleted o-rings leads to in-film oxygen concentrations of $10^{18}$ atoms/cc (i.e., the level at which oxygen concentration does not affect sheet resistance) within 2–3 days; when non-moisture-depleted o-rings were used, it took more than five weeks to achieve this level, during which time approximately 1500 wafers were processed.

As noted above, o-rings should remain under vacuum with the nitrogen purge for the minimum calculated process time or until they are needed, whichever is greater. The vacuum chamber should therefore be considered an o-ring storage facility. Once the moisture depletion process starts for o-rings, i.e., when the o-rings are placed under vacuum, the vacuum should remain undisturbed. Adding additional o-rings to the vacuum chamber at a much later time will recontaminate those o-rings which were undergoing processing prior to the new o-rings being added. Cycling the chamber to atmosphere should also be avoided since that adds moisture, requiring additional process time to remove that moisture. If the vacuum chamber must be opened for maintenance issues, the o-rings must be stored in a nitrogen-purged cabinet. When the chamber is ready again, the o-ring conditioning can be resumed.

O-rings should not be removed from vacuum until they are to be installed on the CVD reactor. Once they are installed, an N2 purge box or something similar should be used to minimize exposure to atmosphere until the system is closed. As noted above, o-rings should be handled with gloves and all surfaces with which the o-rings will come into contact should be wiped with IPA, though the o-rings should not be wiped IPA once they are processed.

Once the o-rings are installed, cold chamber leakrates should be taken before heat is applied. The temperature should be slowly ramped over a period of 3–12 hours to no greater than 300° C. Following temperature ramping and chamber seasoning, SIMS and sheet resistance monitors should be taken periodically to determine overall effectiveness of the outgassing routine.

The invention claimed is:

1. A method for preparing a moisture-depleted o-ring comprising:
   a) calculating an amount of time required for an o-ring of known dimensions to be placed under vacuum to achieve a desired outgassing rate;
   b) placing the o-ring under vacuum for the calculated amount of time, wherein moisture in the o-ring is depleted while it is under vacuum and the o-ring is not heated while it is under vacuum; and c) removing the o-ring from the vacuum when the calculated amount of time has expired.

2. The method of claim 1 further comprising placing the o-ring in an inert atmosphere while it is under vacuum.

3. A method for reducing the oxygen concentration in a chamber due to outgassing from a sealing o-ring, said method comprising:

a) calculating an amount of time required for at least one sealing ring of known dimensions to be placed under vacuum to achieve a desired outgassing rate;

b) before attaching at least one sealing o-ring to the chamber, placing the at least one sealing o-ring for the chamber under vacuum for the calculated amount of time, wherein moisture in the sealing o-ring is depleted while it is under vacuum and the sealing o-ring is not heated while it is under vacuum;

c) removing the at least one sealing ring from under vacuum when the calculated amount of time has expired; and d) attaching the at least one sealing o-ring to the chamber, wherein the oxygen concentration in the chamber is primarily due to permeation.

4. The method of claim 3 further comprising placing the o-ring in an inert atmosphere while it is under vacuum.

* * * * *